United States Patent
Tanaka et al.

(10) Patent No.: US 7,929,154 B2
(45) Date of Patent: Apr. 19, 2011

(54) LASER IRRADIATION APPARATUS AND LASER IRRADIATION METHOD AND METHOD FOR MANUFACTURING SEMICONDUCTOR DEVICE

(75) Inventors: Koichiro Tanaka, Kanagawa (JP); Yoshiaki Yamamoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 143 days.

(21) Appl. No.: 11/640,394

(22) Filed: Dec. 18, 2006

(65) Prior Publication Data
US 2007/0139660 A1    Jun. 21, 2007

(30) Foreign Application Priority Data

Dec. 20, 2005   (JP) .................................. 2005-367270

(51) Int. Cl.
*G01B 11/14* (2006.01)
(52) U.S. Cl. ...................... 356/614; 356/376; 356/237.1; 356/237.5
(58) Field of Classification Search .................. 356/601, 356/614, 237.1–237.5; 359/212.1, 226.1
See application file for complete search history.

(56) References Cited

U.S. PATENT DOCUMENTS

| | | | |
|---|---|---|---|
| 4,970,546 A | 11/1990 | Suzuki et al. | |
| 5,097,291 A | 3/1992 | Suzuki | |
| 5,119,390 A | 6/1992 | Ohmori | |
| 5,140,600 A | 8/1992 | Rebhan | |
| 5,463,650 A | 10/1995 | Ito et al. | |
| 5,473,412 A | 12/1995 | Ozawa | |
| 5,854,803 A | 12/1998 | Yamazaki et al. | |
| 5,999,266 A * | 12/1999 | Takahashi et al. | 356/613 |
| 6,210,996 B1 | 4/2001 | Yamazaki et al. | |
| 6,468,842 B2 | 10/2002 | Yamazaki et al. | |
| 6,633,376 B1 * | 10/2003 | Nishida et al. | 356/237.5 |
| 6,706,570 B2 | 3/2004 | Yamazaki et al. | |
| 6,784,030 B2 | 8/2004 | Yamazaki et al. | |
| 6,861,614 B1 | 3/2005 | Tanabe et al. | |

(Continued)

FOREIGN PATENT DOCUMENTS

EP    1 067 593 A2    1/2001

(Continued)

OTHER PUBLICATIONS

Invitation to Pay Additional Fees issued in corresponding PCT Application No. PCT/JP2006/325003; PCT9286 dated Jan. 16, 2007.

*Primary Examiner* — Tarifur R. Chowdhury
*Assistant Examiner* — Isiaka O Akanbi
(74) *Attorney, Agent, or Firm* — Nixon Peabody LLP; Jeffrey L. Costellia

(57) ABSTRACT

The present invention provides a laser irradiation apparatus and a laser irradiation method which can conduct irradiation of a laser beam accurately by correcting misalignment of an irradiation position of the laser beam from the predetermined position due to temperature change. A laser irradiation apparatus includes a laser oscillator emitting a laser beam; an XY stage provided with an irradiation object; an optical system which shapes the laser beam into a linear beam on a surface of the irradiation object provided on the XY stage; an illumination device which emits light to the surface of the irradiation object; and a camera for imaging reflected light of the light on the surface of the irradiation object, in which misalignment of an irradiation position of the linear beam detected from the reflected light imaged by the camera is corrected.

15 Claims, 11 Drawing Sheets

U.S. PATENT DOCUMENTS

| | | |
|---|---|---|
| 7,006,237 B2 * | 2/2006 | Iwata .............................. 356/614 |
| 7,050,878 B2 | 5/2006 | Yamazaki et al. |
| 7,397,592 B2 * | 7/2008 | Tanaka ........................ 359/212.1 |
| 2002/0003629 A1 * | 1/2002 | Matsui ........................... 356/614 |
| 2003/0048439 A1 * | 3/2003 | Yoshida et al. ............ 356/237.5 |
| 2003/0171837 A1 | 9/2003 | Yamazaki et al. |
| 2004/0041158 A1 * | 3/2004 | Hongo et al. .................... 257/79 |
| 2004/0069751 A1 * | 4/2004 | Yamazaki et al. ......... 219/121.6 |
| 2004/0105092 A1 * | 6/2004 | Iwata ........................ 356/237.2 |
| 2005/0036190 A1 * | 2/2005 | Tanaka .......................... 359/223 |
| 2005/0109743 A1 | 5/2005 | Tanabe et al. |
| 2005/0139582 A1 * | 6/2005 | Tanaka ..................... 219/121.75 |
| 2005/0214986 A1 | 9/2005 | Tanaka et al. |
| 2006/0155413 A1 | 7/2006 | Yamazaki et al. |
| 2006/0227317 A1 * | 10/2006 | Henderson et al. ............. 356/28 |

FOREIGN PATENT DOCUMENTS

| | | |
|---|---|---|
| JP | 06-291075 | 10/1994 |
| JP | 2000-346618 | 12/2000 |
| JP | 2001-023918 | 1/2001 |
| JP | 2003-224084 | 8/2003 |
| JP | 2005-311327 | 11/2005 |

* cited by examiner

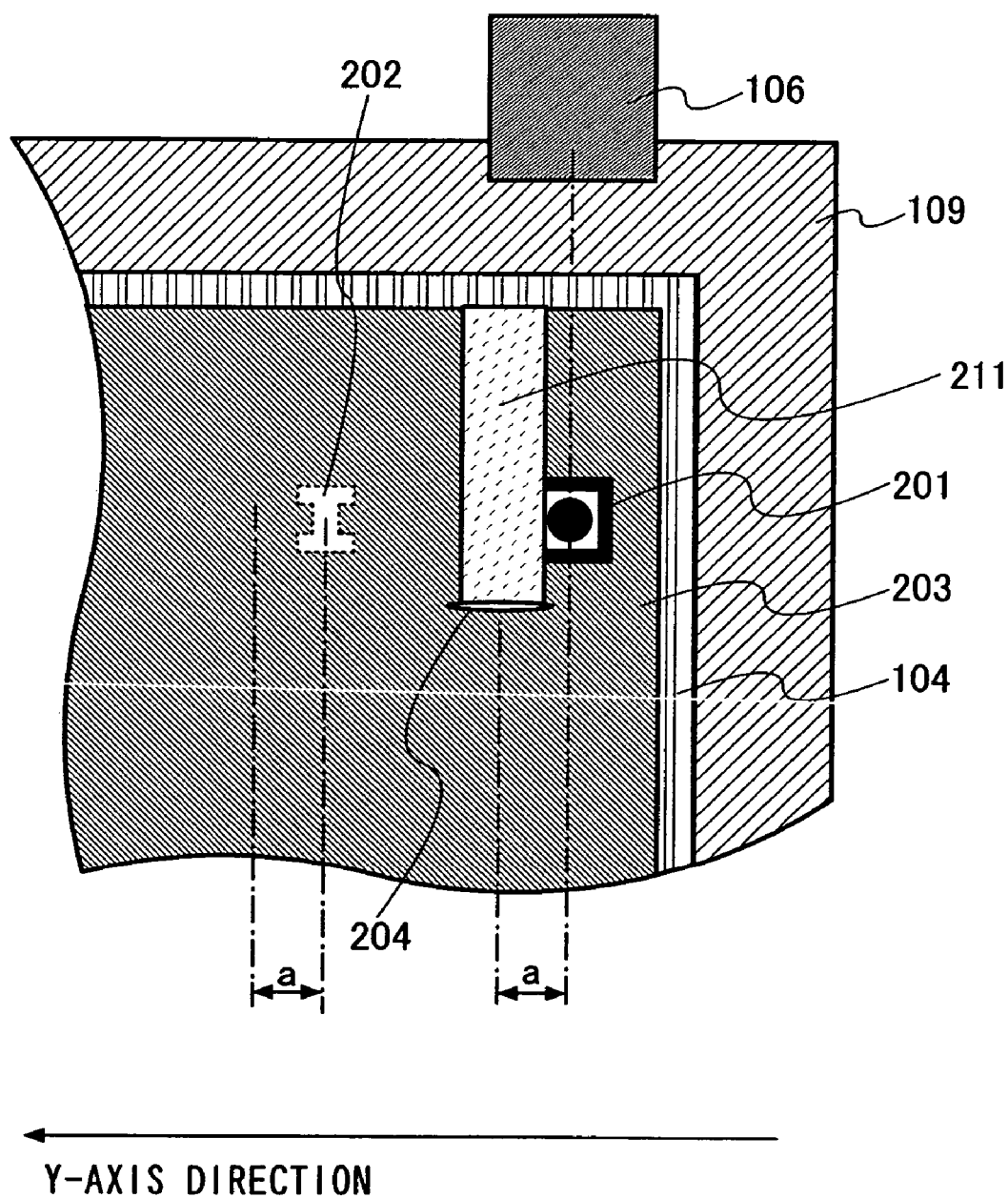

AREA TAKEN BY CCD

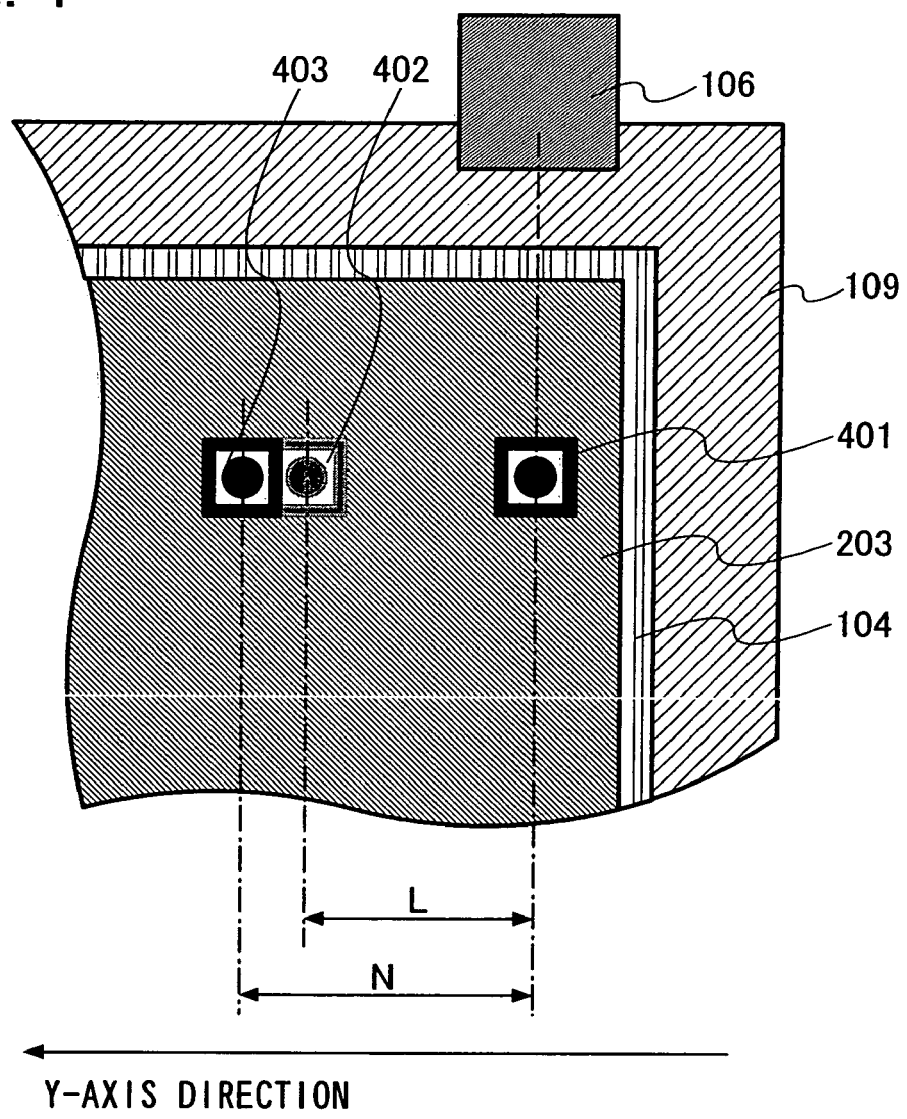

701 702 700

606a 704 708 705 706 707

716 717 718 719 720 721 722 723
724
715
714
710 711 712 713

LASER IRRADIATION APPARATUS AND LASER IRRADIATION METHOD AND METHOD FOR MANUFACTURING SEMICONDUCTOR DEVICE

TECHNICAL FIELD

The present invention relates to a laser irradiation apparatus and a laser irradiation method which conducts irradiation of a linear beam to an object.

BACKGROUND ART

In recent years, a technique for manufacturing a thin film transistor (hereinafter referred to as a TFT) over a substrate has drastically progressed and development for applying a TFT to an active matrix display device has been advanced. In particular, since a TFT using a polycrystalline semiconductor film has higher electric field effect mobility (also referred to as mobility, simply) than a conventional TFT using a non-single crystal semiconductor film, high speed operation is possible. Therefore, it has been attempted that a pixel, which has been conventionally controlled by a driver circuit provided outside a substrate, is controlled by a driver circuit provided over the same substrate as the pixel.

A substrate used for a semiconductor device is expected to be a glass substrate rather than a quartz substrate in terms of cost. However, a glass substrate is inferior in heat resistance and easy to be deformed due to heat. Therefore, when a TFT using a polycrystalline semiconductor film is formed over a glass substrate, laser annealing is often employed for crystallizing a semiconductor film in order to prevent the glass substrate from being deformed due to heat.

Compared with another annealing method which uses radiation heat or conduction heat, the laser annealing has advantages such that the process time can be shortened drastically and that a semiconductor substrate or a semiconductor film can be heated selectively or locally so that thermal damage is hardly given to the substrate.

In this specification, the laser annealing method means a technique of crystallizing a damaged layer or an amorphous layer formed in a semiconductor substrate or a semiconductor film, a technique of crystallizing an amorphous semiconductor film formed over a substrate. Moreover, the laser annealing includes a technique applied to planarize or modify a surface of a semiconductor substrate or a semiconductor film.

In this specification, when a laser irradiation position on a semiconductor substrate is determined with accuracy, a method is employed, in which a marker serving as a reference is provided on an irradiation surface and the irradiation position is controlled based on the marker by a video processing means including a CCD camera, a personal computer or the like (for example, Reference 1: Japanese Published Patent Application No. 2003-224084).

DISCLOSURE OF INVENTION

However, even when a position for starting laser irradiation is determined once using a marker provided on an irradiation surface as a reference by the method shown in Reference 1, there is a problem in that the position of laser irradiation is misaligned from the predetermined position.

As for the first factor, there is a reason that a stage, a glass substrate, a scale or the like expands or shrinks due to temperature, and thus, if the around temperature changes, a difference in the absolute position is generated. As the glass substrate becomes larger, the scale used for determining a position of the stage is also elongated, and thus, this influence becomes large, which is not negligible.

As for the second factor, there is a reason that, when a movement device such as a stage or the like is used, the movement amount is not absolutely accurate, and even if the accuracy is adequate, a difference in an absolute position is generated, from another device such as a stepper forming a marker.

As for the third factor, there is a reason that an internal optical system or casing thermally expands or shrinks in the laser oscillator due to change of temperature in the surrounding environment or temperature change of coolant, and then, misalignment of irradiation angle or position is caused.

Due to the misalignment of irradiation position of a laser beam from the predetermined position, a region which should be crystallized remains amorphous or a region is irradiated with a laser beam plural times, or a TFT is formed in an uneven part of opposite sides of a large crystal grain region. Even when a TFT is formed using a semiconductor film formed in this manner, the electric characteristics fluctuate greatly to reduce reliability.

The present invention has been made in view of the above problem. It is an object of the present invention to provide a laser irradiation apparatus and a laser irradiation method which can conduct irradiation of a laser beam accurately by correcting misalignment of an irradiation position of the laser beam from the predetermined position, due to temperature change. It is another object of the present invention to provide a method for forming a highly reliable TFT by using a method for correcting misalignment of an irradiation position of a laser beam from a predetermined position.

One feature of a laser irradiation apparatus of the present invention is that a region irradiated with a laser beam is scanned by a camera and misalignment of an irradiation position of a laser beam from a predetermined position is corrected. In addition, another feature is that the distance between markers provided on a substrate is scanned and a difference between the distance and a predetermined distance between the markers is detected and corrected.

One feature of the present invention is a laser irradiation apparatus including a laser oscillator emitting a laser beam; an XY stage; an optical system which shapes the laser beam into a linear beam on a surface of an irradiation object provided on the XY stage; an illumination which emits light to the surface of the irradiation object; and a camera for detecting reflected light of the light on the surface of the irradiation object, wherein misalignment of an irradiation position of the linear beam detected from the reflected light detected by the camera is corrected.

One feature of the present invention is a laser irradiation apparatus including a laser oscillator emitting a laser beam; an XY stage; an optical system which shapes the laser beam into a linear beam on a surface of an irradiation object in which at least two alignment markers are formed and which is provided on the XY stage; a camera for imaging the two alignment markers; and a video processing device for detecting a distance between the two alignment markers from an image imaged by the camera, wherein misalignment of an irradiation position of the linear beam is corrected by correcting a difference between the distance between the two alignment markers and a predetermined distance between the two alignment markers.

One feature of the present invention is a laser irradiation apparatus including a laser oscillator emitting a laser beam; an XY stage; an optical system which shapes the laser beam into a linear beam on a surface of an irradiation object in which at least two alignment markers are formed and which is provided on the XY stage; an illumination which emits light to the surface of the irradiation object; a camera for detecting the two alignment markers and reflected light of the light on the surface of the irradiation object; and a video processing device which detects a distance between the two alignment markers from an image detected by the camera, wherein misalignment of an irradiation position of the linear beam detected from the reflected light detected by the camera is corrected by correcting a difference between the distance between the two alignment markers and a predetermined distance between the two alignment markers.

One feature of the present invention is a laser irradiation apparatus in which the irradiation object is a semiconductor film formed over a glass substrate.

One feature of the present invention is a laser irradiation apparatus in which the laser oscillator is one of a YAG laser, a $YVO_4$ laser, a $GdVO_4$ laser, a YLF laser, and an Ar laser.

One feature of the present invention is a laser irradiation method including the steps of irradiating a surface of an irradiation object with a linear beam; detecting reflected light of light which is emitted to the surface of the irradiation object, by a camera; and correcting misalignment of an irradiation position of the linear beam which is detected from the reflected light detected by the camera.

One feature of the present invention is a laser irradiation method including the steps of imaging a surface of an irradiation object in which at least two alignment markers are provided, by a camera; detecting a distance between the two alignment markers from an image imaged by the camera; and correcting misalignment of an irradiation position of a linear beam which is emitted the surface of the irradiation object by correcting a difference between the distance between the two alignment markers and a predetermined distance between the two alignment markers.

One feature of the present invention is a laser irradiation method including the steps of imaging a surface of an irradiation object in which at least two alignment markers are provided, by a camera; detecting a distance between the two alignment markers from an image imaged by the camera; correcting misalignment of an irradiation position of a linear beam which is emitted to the surface of the irradiation object, by correcting a difference between the distance between the two alignment markers and a predetermined distance between the two alignment markers; irradiating the surface of the irradiation object with the linear beam; detecting reflected light of light which is emitted to the surface of the irradiation object by the camera; and correcting misalignment of the irradiation position of the linear beam which is detected from the reflected light detected by the camera.

A region which is not adversely affected by laser beam irradiation and which is laser-annealed by laser irradiation, or a plurality of markers provided in a direction crossing a scanning direction of a liner beam is/are detected by a position detection means such as a camera or the like, the irradiation position of a laser beam is corrected, thereby minimizing misalignment of the irradiation position of the laser beam caused by thermal expansion or shrinkage due to the temperature change, and delivering a laser beam onto an irradiation surface with high accuracy.

BRIEF DESCRIPTION OF DRAWINGS

In the accompanying drawings:
FIG. 2 is a schematic view of a laser irradiation apparatus;
FIG. 4 is a schematic view of a laser irradiation apparatus.

BEST MODE FOR CARRYING OUT THE INVENTION

Embodiment Mode

Figure 1:
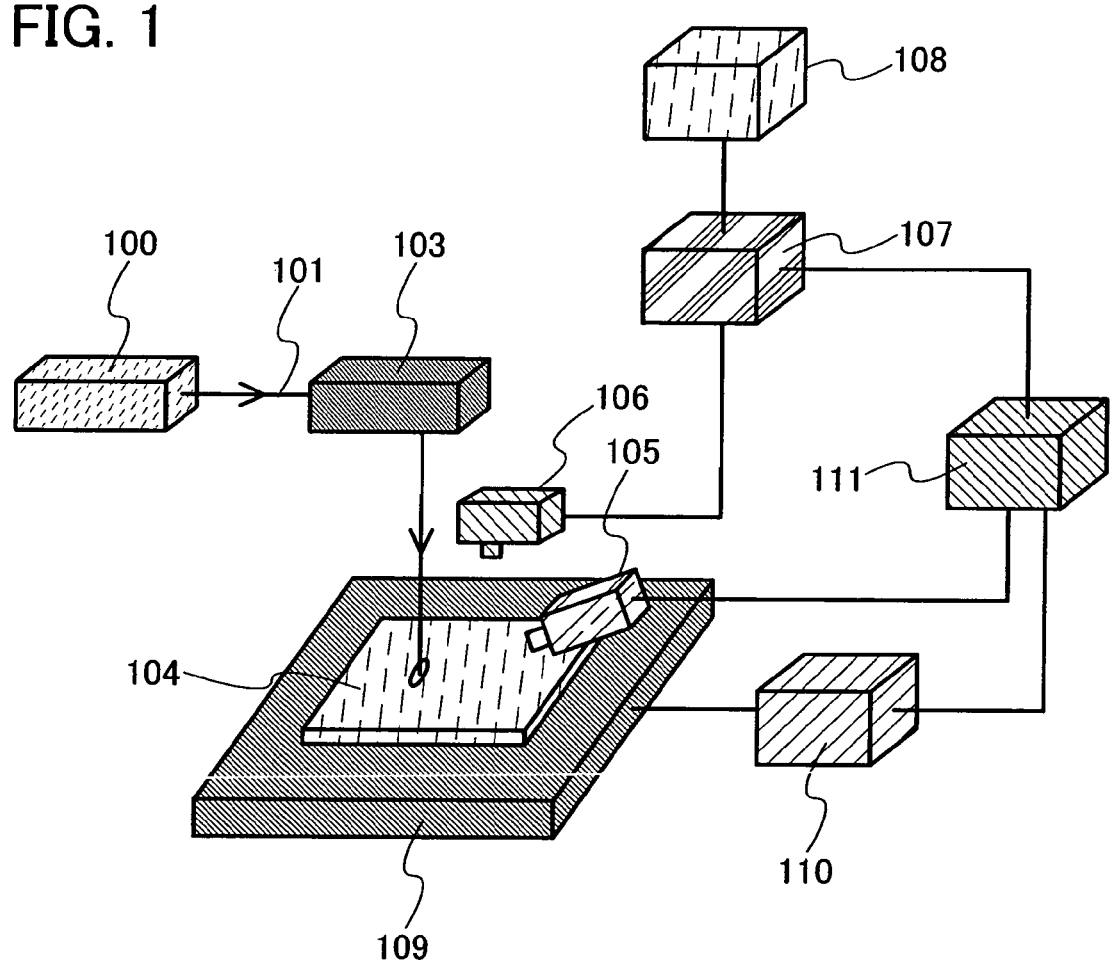
FIG. 1 is a schematic view of a laser irradiation apparatus.

Best Modes for carrying out the present invention will be described with reference to the drawings. The present invention is not limited to the modes given below. It is easily understood by those skilled in the art that modes and details disclosed herein can be modified in various ways without departing from the spirit and the scope of the present invention. It should be noted that the present invention should not be interpreted as being limited to the description of the embodiment modes given below. Note that like portions or portions having like functions in embodiment modes are denoted by the same reference numerals and descriptions thereof are not repeated.

Embodiment Mode 1

Embodiment Mode 1 will describe a method for correcting misalignment from a predetermined position of a laser beam by observing a laser-annealed region after laser irradiation, with reference to FIG. 1 to FIG. 3. This embodiment mode shows an example in which a glass substrate over which a semiconductor film including a marker is formed is set on an XY stage, and the semiconductor film is annealed by irradiation of a linear beam. The linear beam indicates a laser beam having a linear shape on an irradiation surface. It is to be noted that the term of "linear" used herein does not mean a line in a strict sense but means a rectangle having a high aspect ratio (for example, aspect ratio of 10 or more (preferably 100 or more)). The linear shape is adopted because energy density required for sufficient annealing to an irradiation object can be secured. Therefore, as long as sufficient annealing can be conducted to the irradiation object, the laser beam may be shaped into a rectangular or elliptical shape.

FIG. 1 is a schematic view showing a structure of Embodiment Mode 1. In FIG. 1, a laser beam 101 emitted from a laser oscillator 100 passes through an optical system 103 and delivered onto a surface of a glass substrate 104. Then, the surface of the glass substrate 104 is subjected to light of an illumination device 105, and the reflected light enters a camera 106. The camera 106 converts a pattern of a region irradiated with the laser beam 101 and a vicinity thereof into a video signal, the converted video signal is sent to a video processing device 107, and a video signal processed in the video processing device 107 is sent to a monitor 108. An operator can observe the pattern of the region irradiated with the laser beam 101 and the vicinity thereof by the monitor 108. Note that in this embodiment mode, an XY stage 109 on which the glass substrate 104 is set is scanned by a driving device 110, and the driving device 110, the video processing device 107 and the illumination device 105 are controlled by a controller 111. In addition, with the camera 106 fixed, an observation position can be changed by driving the XY stage 109. The optical system 103 arranged in an optical path between the laser oscillator 100 and the glass substrate 104 is used for forming the laser beam 101 emitted from the laser oscillator 100 into a linear beam on the surface of the glass substrate 104. As the camera 106, a CCD camera can be used, for example.

Next, a method for controlling misalignment of the laser irradiation position is described with reference to FIG. 2. The glass substrate 104 over which a semiconductor film 203 provided with markers 201 and 202 is formed, is prepared. Note that there are no particular limitations on the number of markers, and any number of markers may be provided as long as a laser irradiation position can be determined.

Subsequently, the glass substrate 104 is set on the XY stage 109. At this point, a straight line connecting the two markers 201 and 202, a longitudinal direction of the linear beam 204, and the Y-axis of the XY stage 109 are preferably arranged to be parallel with each other. Then, by moving the XY stage 109, after detecting the position of the marker 201 by the camera 106, the glass substrate 104 is moved in the Y direction from the detected position of the marker 201, and the marker 202 is detected by the camera 106. In this manner, the laser irradiation position is determined. However, the longitudinal direction of the linear beam 204 may be parallel to the X-axis of the XY stage 109, although it is parallel with the Y-axis of the XY stage 109 in the above example. At this time, the Y-axis and Y-axis direction are replaced by the X-axis and X-axis direction, respectively.

Then, the XY stage 109 is moved in the X-axis direction while the semiconductor film 203 is being irradiated with the linear beam 204, thereby annealing the semiconductor film 203 by laser. At this time, the longitudinal direction of the linear beam 204 is set in parallel with the Y-axis direction. After that, the laser-annealed region is detected by the camera 106. In FIG. 2, a region 211 denotes the region irradiated with the linear beam 204.

After that, the XY stage 109 is moved in the X-axis direction again, and the marker is detected by the camera 106. Then, the XY stage 109 is moved in the Y-axis direction and the laser-annealed region, i.e., a large crystal grain region 303 is detected by the camera 106. The distance in which the XY stage moves in the Y-axis direction during a period from detection of the large crystal grain region 303 to the detection of the marker, by the camera 106 is denoted by "a".

At this time, in consideration of irradiation position of the linear beam 204 on the glass substrate 104 and the visible position of the camera 106, a Y-coordinate of the irradiated position of the linear beam 204 and a Y-coordinate of the camera 106 are preferably equal. This is because, since the irradiation position of the linear beam on the glass substrate is determined as the position of the camera 106 as a reference, as their relative positions are more apart, the error becomes larger. However, actually, when the Y-coordinate of the camera 106 is aligned with a predetermined irradiation position (here, the position of the marker 201), it is difficult to deliver the liner beam 204 at the position of the maker 201. Thus, a Y-coordinate of a position which is actually irradiated with the linear beam 204 is misaligned with the Y-coordinates of the camera 106 and the marker 201. In other words, the linear beam 204 is delivered onto a position which is misaligned by the distance "a" from the maker 201 in the Y-axis direction (FIG. 2). Here, the distance "a" is a value measured by an encoder of the XY stage 109. Here, although the distance "a" should be 0 in design, there are many cases where the distance "a" becomes a value other than 0 actually, because of change in the surrounding environment or the like. Thus, by putting the substrate back by the distance "a" in the Y-axis direction, a laser beam can be delivered onto the predetermined irradiation position.

Here, a method for detecting the laser-annealed region by the camera 106 is described. The laser-annealed region of the semiconductor film 203 by irradiating the semiconductor film 203 with the linear beam 204 is different from a region on the surface of the semiconductor film 203 which is not laser-annealed. Therefore, in order to easily detect this region, light is emitted obliquely onto the surface of the semiconductor film 203, and the amount of scattered light may be detected by a CCD camera or the like. The amount of scattered light is different between the laser-annealed region and the region which is not laser-annealed, and thus, it can be judged whether a region is irradiated with the laser beam or not.

Figure 3A:
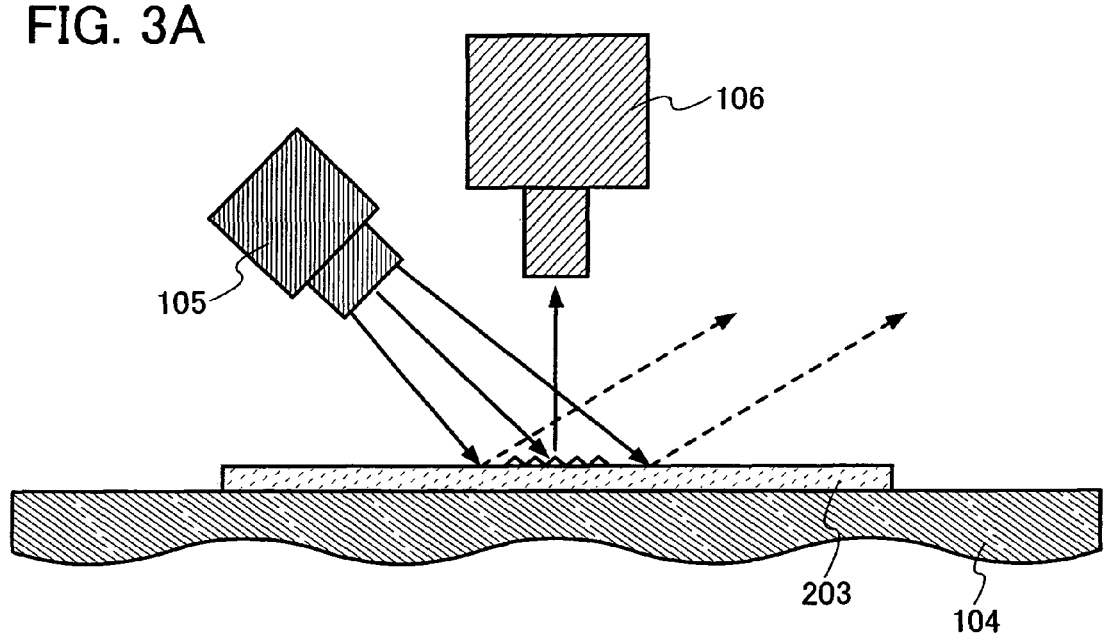
FIGS. 3A and 3B each are a schematic view of a laser irradiation apparatus.
Figure 3B:
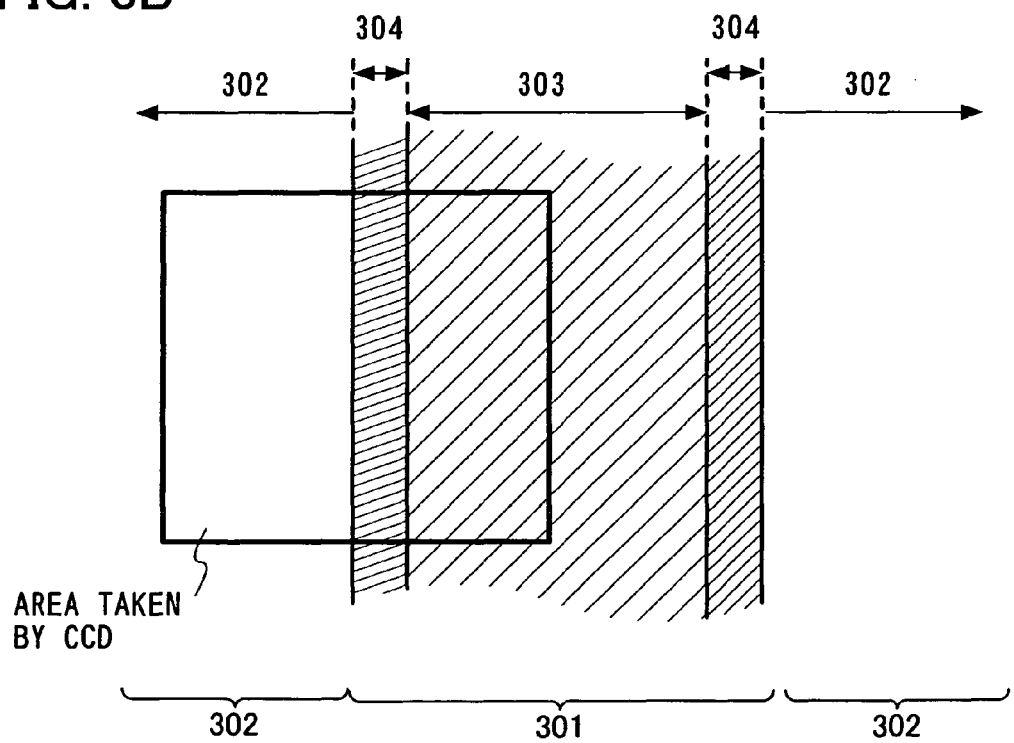

For example, as shown in FIG. 3A, light of the illumination device 105 is emitted obliquely onto the semiconductor film 203, and the angle is adjusted so that specular reflected light from the surface or inside of the glass substrate 104 cannot enter the camera 106. The surface of the irradiated region with the laser beam (also referred to as irradiation region) is more uneven than that of the region which is not irradiated, and thus, the intensity of the scattered light is high and the irradiation region can be detected. Further, as shown in FIG. 3B, by detecting a boarder between an irradiation region 301 of the laser beam and a non-irradiation region 302 with a high-powered camera, the distance "a" can be measured with higher accuracy.

In this embodiment mode, the region which is laser-annealed by irradiation of a laser beam is detected by a position detection means such as a camera or the like, and the irradiation position of a laser beam is corrected. Thus, misalignment of irradiation position of a laser beam caused by thermal expansion or shrinkage due to temperature change is reduced, and the laser beam can be delivered with high accuracy on the semiconductor film. In addition, when a TFT is formed, a region not to be provided with a TFT is laser-annealed and the position is detected by a camera or the like; therefore, characteristics of a TFT are not influenced. Moreover, since a laser beam can be delivered onto a predetermined position of a semiconductor film accurately, the predetermined position can be laser-annealed evenly and a TFT having excellent characteristics can be formed efficiently.

Embodiment Mode 2

Embodiment Mode 2 will describe a method for correcting misalignment from a predetermined irradiation position of a laser beam by detecting a relative position of plural markers. Like parts in FIG. 4 as those in FIG. 1 to FIG. 3 are denoted by the same reference numerals, and description thereof is omitted. FIG. 4 shows a part of the XY stage and a sample provided on the XY stage.

First, the glass substrate 104 having a surface on which the semiconductor film 203 provided with two markers 401 and 403 which are separated by a distance "L" is prepared (FIG. 4). Here, originally the marker 403 should be formed at a position (the position of a marker 402 in FIG. 4) which is separated from the marker 401 by the distance "L" on the glass substrate 104; however, the marker 403 is formed at a position which is separated from the marker 401 by a distance "N" which is different from the distance "L", because of change in the surrounding environment.

Next, the glass substrate 104 is set on the XY stage 109. At this point, a straight line connecting the two markers 401 and 403, a longitudinal direction of the linear beam, and the Y-axis of the XY stage 109 are arranged to be parallel with each other. Then, by moving the XY stage 109, after detecting the position of the marker 401 by the camera 106, the XY stage 109 is moved in the Y direction from the detected position of the marker 401, and the marker 403 is detected by the camera 106. Here, originally, the distance in which the XY stage 109 moves in the Y direction, i.e., the distance between the marker 401 and the marker 403 should be equal to the distance L between the markers 401 and 402 which is determined in design; however, the distance between the markers 401 and 403 becomes a different value from the distance L in design, because of change in the surrounding environment. The distance in which this XY stage 109 moves is denoted by N. Note that this distance N is a value measured by an end-measuring machine such as an encoder attached to the XY stage 109. When this end-measuring machine has a scale having an almost equal thermal expansion coefficient to the glass substrate 104, the glass substrate 104 and the scale change similarly in size in synchronization with around temperature and thus, highly accurate length measurement is possible, irrespective of change in the around temperature.

In the end-measuring machine of the XY stage 109, the distance N is regarded as the distance L and the coordinates of the XY stage 109 are replaced, thereby conducting laser annealing at more accurate position. Here, the example of increasing the accuracy of determining the position in the Y-axis direction is shown. This is because a laser annealing method of the present invention should have a higher accuracy in the longitudinal direction of a linear beam. In addition, the longitudinal direction of the linear beam may be parallel to the X-axis of the XY stage, although it is parallel with the Y-axis of the XY stage in the above example. At this time, the Y-axis and Y-axis direction are replaced by the X-axis and X-axis direction, respectively.

After that, as described in Embodiment Mode 1, after the laser irradiation, the laser-annealed region may be observed so as to correct misalignment from the predetermined position of the laser beam. At this time, the linear beam 204 is delivered at a position which is misaligned by the distance "a" from the camera 106 in the Y-axis direction, similarly to FIG. 2 of Embodiment Mode 1. In this embodiment mode, since the distance N is regarded as the distance L, and the coordinates on the XY stage 109 are replaced, the coordinates of the distance "a" are replaced and converted. Thus, the laser beam can be delivered onto the predetermined irradiation position.

Note that the irradiation position of the laser beam is preferably corrected such that the amount of misalignment in the irradiation position of the laser beam becomes 0; however, in the case where a semiconductor device having the size of several mm square or less, at most several tens mm square, when correction is done in the range of 30 μm or less, preferably 10 μm or less, more preferably 5 μm or less, there are less influence on characteristics of the semiconductor device. In terms of arrangement of a device, when the amount of misalignment of an irradiation position of a laser beam cannot be 0, the amount of misalignment of the irradiation position of the laser beam may be memorized in the device in advance and the amount may be used as a correction value. In this case, an error in the memorized amount of misalignment should be within the above range. By combining Embodiment Mode 1 and Embodiment Mode 2, misalignment of an irradiation position of a laser beam can be corrected with higher accuracy.

In this embodiment mode, by correcting the difference between the predetermined distance between markers and actually measured distance between the markers, misalignment of the irradiation position of a laser beam caused by thermal expansion generated between the stage and the glass substrate, and a scale difference from the device in the before step of forming the markers, can be corrected. Therefore, misalignment of an irradiation position of the laser beam caused by thermal expansion or shrinkage due to temperature change can be reduced, and the laser beam can be delivered onto the semiconductor film with high accuracy. In addition, when a TFT is formed, a region not to be provided with a TFT is laser-annealed and the position is detected by a camera or the like; therefore, characteristics of a TFT are not influenced. Moreover, since the laser beam can be delivered onto a predetermined position of the semiconductor film accurately, the predetermined position can be laser-annealed evenly and a TFT having excellent characteristics can be formed efficiently.

Embodiment Mode 3

Figure 5:
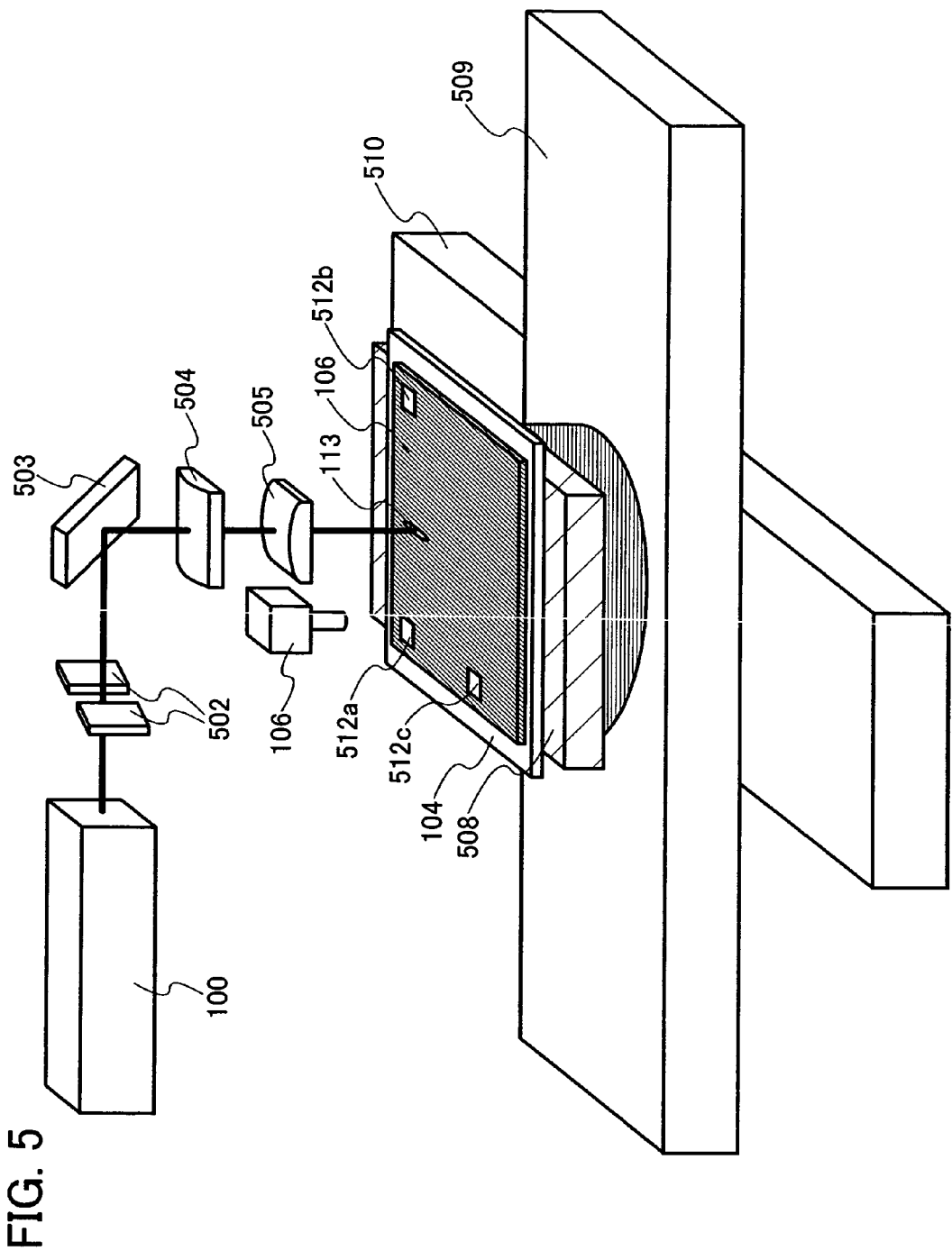
FIG. 5 is a schematic view of a laser irradiation apparatus.

Embodiment Mode 3 will describe a step of crystallizing a semiconductor film. Note that like portions in FIG. 5 to those in FIG. 1 to FIG. 4 are denoted by the same reference numerals and descriptions thereof are omitted. FIG. 5 shows a portion of a laser irradiation apparatus in this embodiment mode.

In this embodiment mode, the laser oscillator shown in FIG. 5 is a CW laser oscillator having an output of 20 W, a wavelength of 532 nm, a beam diameter of 2 mm and a beam lateral mode of $TEM_{00}$.

As for a laser beam emitted from the laser oscillator 100, a portion having a low energy density of the laser beam is blocked by a slit 502, and the laser beam is deflected in the perpendicular direction to the semiconductor film 203 formed over the glass substrate 104, by a mirror 503.

An image made by the slit 502, of the deflected laser beam is projected on the semiconductor film 203 which is an irradiation surface, by a cylindrical lens 504 operating in one direction. At this time, the incident angle of the laser beam is perpendicular to the irradiation surface.

Further, the laser beam is condensed by a cylindrical lens 505 of which operation direction is different by 90° from the cylindrical lens 504, and delivered on the semiconductor film 203. In other words, the cylindrical lens 504 acts on only the longitudinal direction of the liner beam 204 in the irradiation surface, while the cylindrical lens 505 acts on only the short axis.

In the present invention, an optical system including a single slit in an optical path is used in order to reduce an inferior crystalline region 304 and prevent an inferior crystalline region 304 from being formed in a formation region of a TFT. However, diffraction of light is generated when a slit is used, and a striped pattern appears due to influence of diffraction in the semiconductor film. In order to prevent the striped pattern from being generated, the positional relation between the cylindrical lens 504, the slit 502 and the semiconductor film 203 which is the irradiation surface follows the following equations (1) and (2), in the present invention.

$$M1 = f(s+D)/D \quad (1)$$

$$M2 = f(s+D)/s \quad (2)$$

In the quotations 1 and 2, "s" denotes a width of the slit, "D" denotes a length in a longitudinal direction of the linear beam, "f" denotes a focus length of the cylindrical lens, "M1" denotes an interval between the slit 502 and the cylindrical lens 504, and "M2" denotes an interval between the cylindrical lens 504 and the semiconductor film 203 which is the irradiation surface.

Thus, an image made by the slit is projected on the irradiation surface by the cylindrical lenses. At the position of the slit, diffraction is not generated in the laser beam, and thus, a stripe caused by the diffraction is not produced at this position. Accordingly, a stripe is not produced either on the irradiation surface to which an image made by the slit is projected.

In this embodiment mode, when the focus length of the cylindrical lens 504 is 150 mm, the width of the slit is 0.5 mm, the length in the longitudinal direction of the shaped linear beam on the semiconductor film 203 which is the irradiation surface is 0.5 mm, the interval of the optical path between the slit 502 and the cylindrical lens 504 (M1), and the interval of the optical path between cylindrical lens 504 and the semiconductor film 203 (M2) which are required to satisfy the equations (1) and (2) are calculated based on the above values. Thus, the values as shown in the following equations (3) and (4) are obtained.

$$M1 = f(s+D)/D = 150 \times (0.5+0.5)/0.5 = 300 \text{ mm} \quad (3)$$

$$M2 = f(s+D)/s = 150 \times (0.5+0.5)/0.5 = 300 \text{ mm} \quad (4)$$

In this embodiment mode, these components are arranged so as to satisfy the positional relation obtained in the equations (3) and (4), and the laser beam is delivered onto the semiconductor film. Thus, a strip caused by the diffraction is not transferred and the laser beam is delivered evenly to form a uniform large crystal grain region having large crystal grains with a width of 0.5 mm, without unevenness without forming an inferior crystalline region.

While the linear beam which had been shaped into a linear form by the above optical system (linear beam) is being delivered onto the semiconductor film 203 formed over the glass substrate 104 which is set on an X-axis stage 509 and a Y-axis stage 510, the beam is scanned and moved at a speed of 400 mm/sec to form large grain crystals in the entire surface of the glass substrate.

Figure 6:
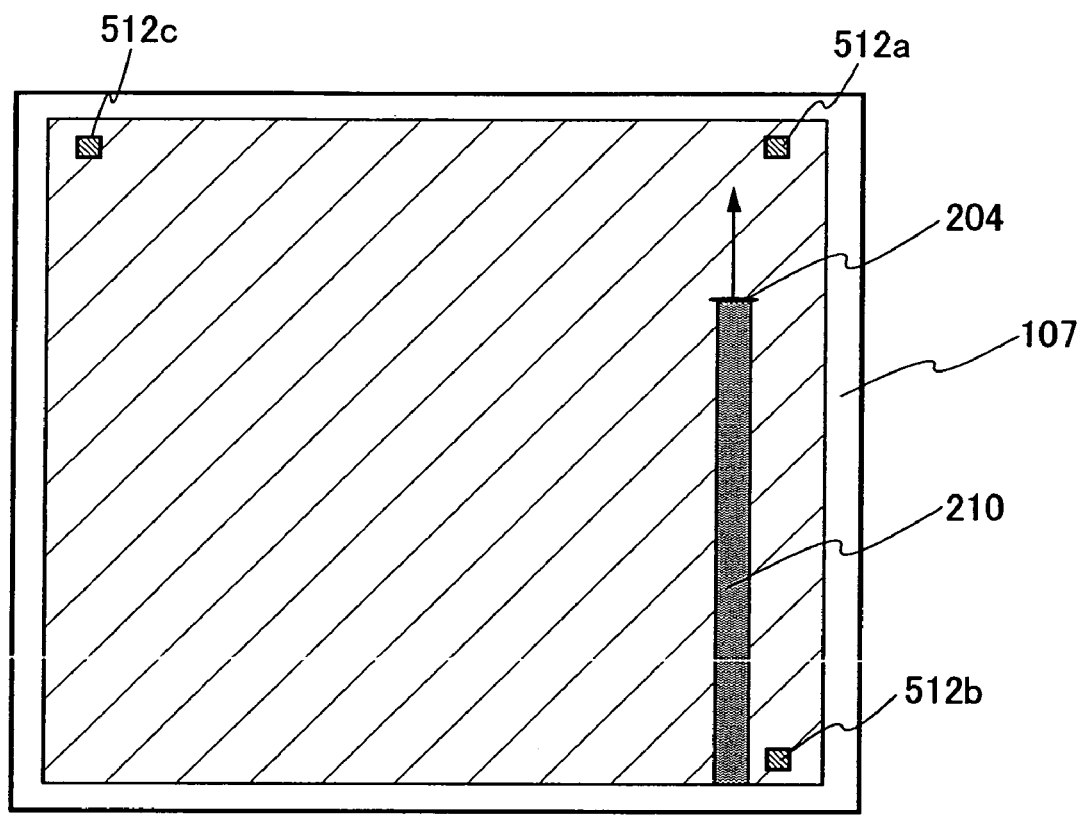
FIG. 6 is a schematic view of a laser irradiation apparatus.

Next, a method for correcting misalignment of a position of laser irradiation is described. A plurality of markers 512a to 512c are provided in the semiconductor film 203 formed over the glass substrate as shown in FIG. 5 and FIG. 6. Note that FIG. 6 is a top view of FIG. 5.

Using the X-axis stage 509, the Y-axis stage 510 and a θ stage 508, the markers 512a and 512b on the semiconductor film 203 each are detected by the CCD camera 106 which is fixed separately from the stages.

Here, in order to increase detection accuracy of the markers, the CCD camera used at this point preferably has a high-powered lens. However, when the accuracy of the marker position becomes worse because of worse accuracy in setting the glass substrate on the stage, a zoom camera may be used or a CCD camera including a low magnification lens for coarse adjustment and a high power lens for fine adjustment may be used, in order to increase the efficient range in which the CCD camera can detect the markers.

The markers 512a and 512b are arranged in parallel with a channel direction of a TFT, and by detecting the markers 512a and 512b and adjusting an angle in the rotation direction using the θ stage 508, the channel direction of the TFT and the scanning direction of the linear beam 204 can be parallel with each other.

If the angle adjustment using the θ stage as just described is not done, there is a possibility that an inferior crystalline region 304 may be formed in the formation region of the TFT and yield may decrease.

After adjusting the angle of the θ stage 508, the markers 512a and 512c are detected by the CCD camera 106 using the X-axis stage 509 and the Y-axis stage 510.

Although the markers 512a and 512c should be separated by a predetermined distance, the interval between the two markers which actually detected by the camera 106 and calculated is slightly misaligned from the predetermined distance. By detecting this misalignment, absolute positions of the X-axis stage and the Y-axis are corrected.

By correcting the misalignment of the position of the linear beam 204, and then scanning the X stage and the Y stage repeatedly, large grain crystals can be formed accurately in a region to be provided with a TFT.

In this embodiment mode, the laser beam can be delivered on the predetermined position of the semiconductor film with accuracy and the predetermined position can be laser-annealed evenly. Therefore, a semiconductor device having excellent quality and less variation can be formed efficiently, which leads to cost reduction effectively. A high speed device can be manufactured since a TFT can be formed from a semiconductor film including crystals having a large diameter in this manner.

Embodiment Mode 4

Embodiment Mode 4 will explain a step of forming a thin film transistor (TFT). Note that this embodiment mode describes a manufacturing method of a top gate type (staggered) TFT; however, the present invention can be applied to a bottom gate type (inversely staggered) TFT or the like, too, without being limited to the top gate type TFT. Note that the present invention can be carried out in many different modes. It is easily understood by those skilled in the art that modes and details disclosed herein can be modified in various ways without departing from the spirit and the scope of the present invention. Therefore, it is noted that the present invention should not be interpreted as being limited to the description of this embodiment mode. In addition, this embodiment mode can be freely combined with any of the other embodiment modes.

Figure 7:
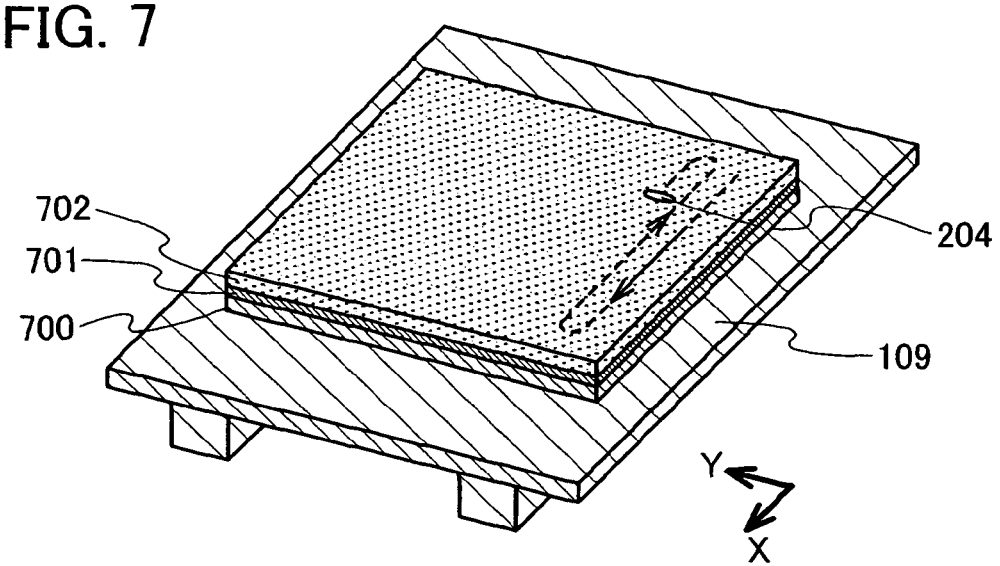
FIG. 7 is a view showing a manufacturing step of a semiconductor device according to an aspect of the present invention.

FIG. 7 shows the XY stage 109 of FIG. 1. The XY stage 109 includes a suction function, and can move in the X-axis direction or the Y-axis direction. As shown in FIG. 7, on the XY stage 109 having the suction function, a device in which an insulating substrate 700 having an insulating surface, a base film 701, and an amorphous semiconductor film 702 are sequentially formed is set. The insulating substrate 700 may be, for example, a glass substrate such as barium borosilicate glass or alumino borosilicate glass, a quartz substrate, a stainless steel substrate, or the like. In addition, although a substrate made of flexible synthetic resin such as acrylic or plastic typified by PET, PES, PEN, or the like tends to have lower temperature against heat than other substrates, in general, a substrate made of flexible synthetic resin can be used as long as the substrate can resist the processing temperature in the manufacturing process.

The base film 701 is provided in order to prevent an alkali-earth metal or alkali metal such as Na included in the insulating substrate 700 from diffusing into a semiconductor film and adversely affecting on characteristics of the semiconductor element. Therefore, the base film is formed of an insulating material such as silicon oxide, silicon nitride, or silicon oxide including nitride, silicon nitride including oxygen or the like which can suppress the diffusion of an alkali-earth metal and alkali metal into the semiconductor film. For example, a silicon nitride oxide film is formed in thickness from 10 to 400 nm by a plasma CVD method. When a substrate such as a quartz substrate is used which hardly diffuses impurities, the base film is not always necessary to be provided.

Next, an amorphous semiconductor film 702 is formed over the base film 701 in thickness from 25 to 100 nm (preferably from 30 to 60 nm). The amorphous semiconductor film can be silicon or silicon including germanium. When silicon including germanium is used, it is preferable that the concentration of germanium is in the range of approximately 0.01 to 4.5 atomic %.

Figure 8:
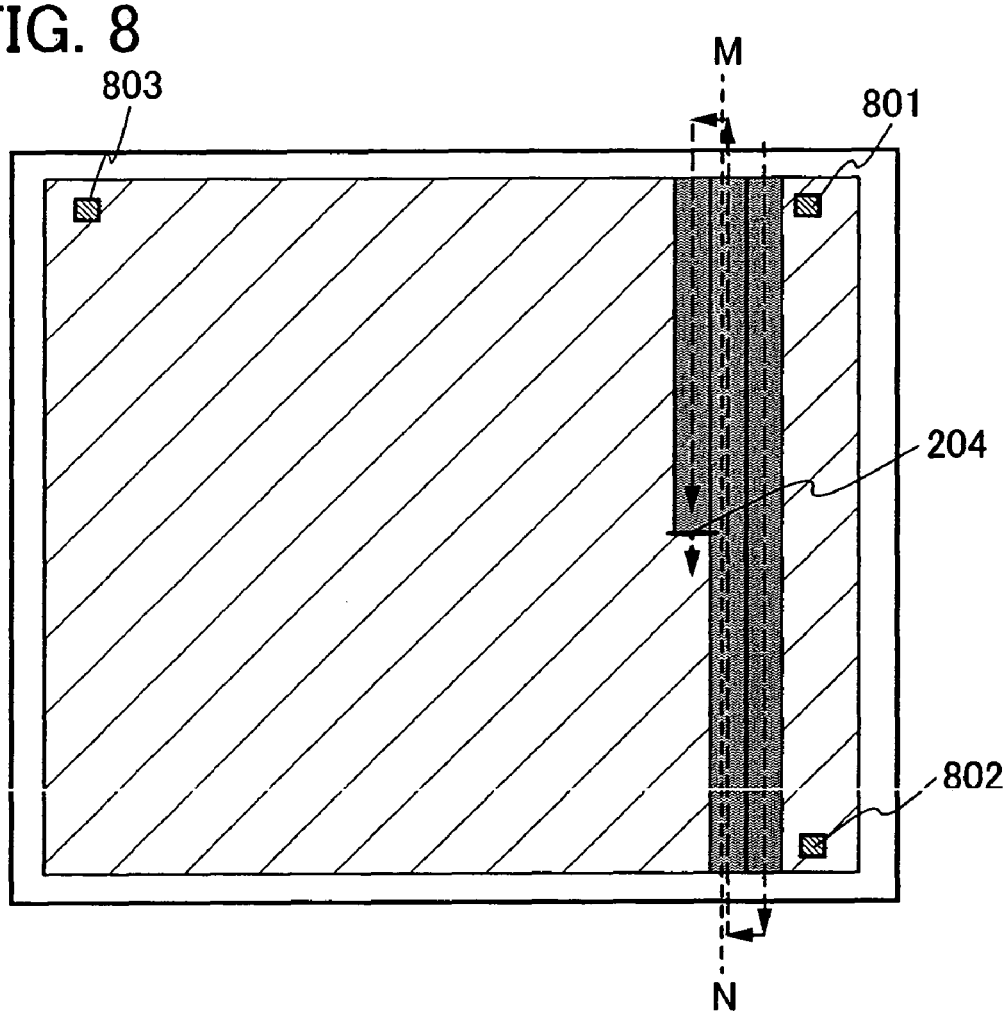
FIG. 8 is a view showing a manufacturing step of a semiconductor device according to an aspect of the present invention.

FIG. 8 is a top view of FIG. 7. On the amorphous semiconductor film 702, a plurality of alignment markers 801 to 803 are formed. Here, by any of the methods shown in Embodiment Mode 1 and Embodiment Mode 2, misalignment of the linear beam 204 from a predetermined position is corrected. In FIG. 7 and FIG. 8, the linear beam 204 is delivered along the arrow.

Figure 9A:
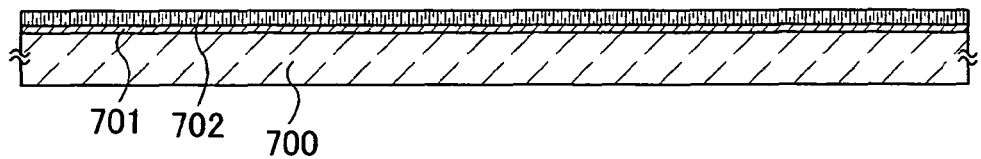
FIGS. 9A to 9D each are a view showing a manufacturing step of a semiconductor device according to an aspect of the present invention.
Figure 9B:
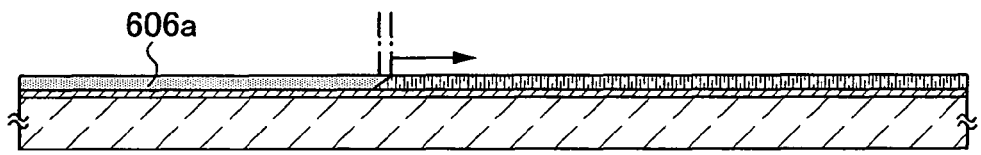

FIGS. 9A to 9D are cross-sectional views taken along a dotted line connecting M and N in FIG. 8. As shown in FIG. 9A, the base film 701 and the amorphous semiconductor film 702 are sequentially stacked over the insulating substrate 700. The linear beam is scanned on the surface of the amorphous semiconductor film 702 in a direction indicated by an arrow shown in FIG. 9B. By the irradiation of the linear beam, crystal grains grown continuously in the scanning direction of the linear beam are formed. As described above, TFTs with almost no crystal grain boundaries in a direction where carriers move in a channel of the crystalline semiconductor film 606a can be formed by forming crystal grains extending long in the scanning direction of the linear beam.

Figure 9C:
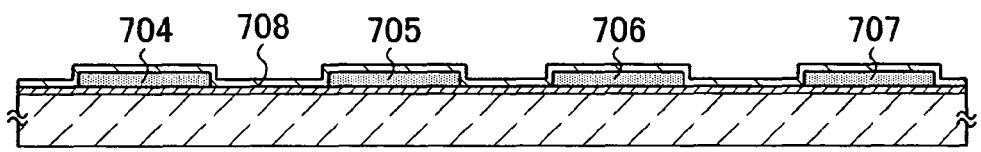

After that, the crystalline semiconductor film 606a is processed as shown in FIG. 9C, thereby forming island-shaped semiconductor films 704 to 707. By using the island-shaped semiconductor films 704 to 707, various semiconductor elements typified by TFTs are formed. Next, a gate insulating film 708 is formed so as to cover the island-shaped semiconductor films 704 to 707. The gate insulating film 708 can be formed from, for example, silicon oxide, silicon nitride, silicon nitride oxide or the like by a plasma CVD method, a sputtering method, or the like. For example, an insulating film containing silicon with a thickness of 30 nm to 200 nm may be formed by a sputtering method.

Figure 9D:
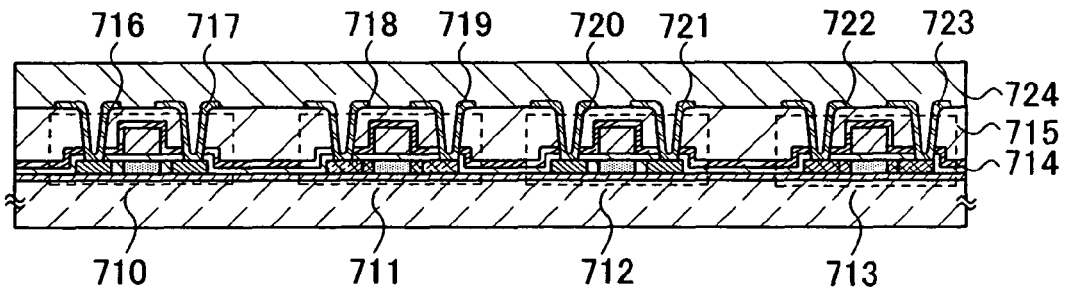

Next, a conductive film is formed over the gate insulating film and etched, thereby forming a gate electrode. After that, an impurity element imparting an n-type or p-type conductivity is selectively added into the island-shaped semiconductor films 704 to 707 by using the gate electrode or a resist which has been formed and then etched, as a mask, thereby forming a source region, a drain region, an LDD region, or the like. By the above-mentioned steps, N-channel transistors 710 and 712, and P-channel transistors 711 and 713 can be formed over one substrate (FIG. 9D). Subsequently, an insulating film 714 is formed to protect those transistors as a protective film. This insulating film 714 may be formed as a single-layer structure or a multilayer structure using an insulating film containing silicon of 100 to 200 nm thick by a plasma CVD method or a sputtering method. For example, a silicon oxynitride film of 100 nm thick may be formed by a plasma CVD method.

An organic insulating film 715 is formed over the insulating film 714. The organic insulating film 715 is formed from an organic insulating film such as polyimide, polyamide, BCB, or acrylic applied by an SOG method. The organic insulating film 715 is preferably a film superior in flatness because the insulating film 715 is formed mainly for a purpose of relaxing and flattening the unevenness due to TFTs formed over the insulating substrate 700. Moreover, by a photolithography method, the insulating film 714 and the organic insulating film 715 are patterned to form a contact hole that reaches an impurity region.

Next, a conductive film is formed from a conductive material and patterned, thereby forming wirings 716 to 723. After that, when an insulating film 724 is formed as a protective film, a semiconductor device shown in FIG. 9D is obtained. The method for manufacturing a semiconductor device using a laser annealing method of the present invention is not limited to the above-mentioned manufacturing steps of TFTs described above. In this embodiment mode, the crystalline semiconductor film obtained by the laser irradiation method is used as an active layer of a TFT. Accordingly, it is possible to suppress the variation in mobility, threshold, and on-current between the elements. The irradiation condition of the laser beam is not limited to that shown in this embodiment mode.

A crystallization step using a catalyst element may be provided before the crystallization using the laser beam. As the catalyst element, nickel (Ni) is used. Further, an element such as germanium (Ge), iron (Fe), palladium (Pd), tin (Sn), lead (Pb), cobalt (Co), platinum (Pt), copper (Cu), or gold (Au) can be used. In the case where after the crystallization step using the catalyst element, the crystallization step using a laser beam is conducted, crystals formed in the crystallization step using the catalyst element remain without being melted by the irradiation of the laser beam, and crystallization progresses with these crystals as crystal nuclei.

Therefore, as compared with the case of conducting only a crystallization step by the laser beam, the crystallinity of the semiconductor film can be more enhanced and the roughness of the surface of the semiconductor film after the crystallization by the laser beam can be suppressed. Thus, the variation in the characteristic between semiconductor elements to be formed afterward, typically TFTs, can be suppressed further, and the off-current can be suppressed. It is noted that the crystallization may be performed in such a way that the heat treatment is performed after the catalyst element is added in order to promote the crystallization and that the laser irradiation is performed in order to enhance the crystallinity further. Alternatively, the heat treatment may be omitted. Specifically, after adding the catalyst element, the semiconductor film may be irradiated with the laser beam instead of the heat treatment so as to enhance the crystallinity.

In this embodiment mode, the laser beam can be delivered on the predetermined position of the semiconductor film with accuracy and the predetermined position can be laser-annealed evenly. Therefore, a semiconductor device having excellent quality and less variation can be formed efficiently, which leads to cost reduction effectively.

Embodiment Mode 5

Various electronic devices can be manufactured using a semiconductor device which is formed by a method of correcting misalignment of a laser irradiation position of the present invention. Specific examples of electronic devices are described with reference to the drawings. Note that the present invention can be carried out in many different modes.

It is easily understood by those skilled in the art that modes and details disclosed herein can be modified in various ways without departing from the spirit and the scope of the present invention. Therefore, it is noted that the present invention should not be interpreted as being limited to the description of this embodiment mode. In addition, this embodiment mode can be freely combined with any of the other embodiment modes.

Figure 10A:
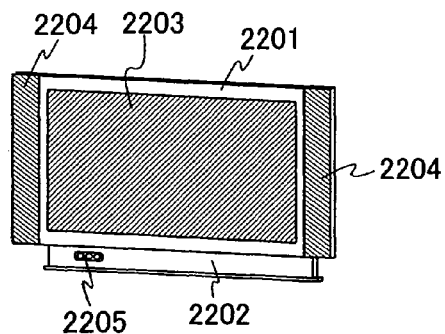
FIGS. 10A to 10F each show an electronic device using a semiconductor device manufactured according to an aspect of the present invention.

FIG. 10A shows a display device including a casing 2201, a support 2202, a display portion 2203, a speaker portion 2204, a video input terminal 2205, and the like. Pixels in the display portion 2203 include thin film transistors which are manufactured by the similar method to Embodiment Mode 3. This makes it possible to enlarge the area of a crystal region without causing interference stripes due to laser irradiation to appear on a semiconductor film, to decrease the area of an inferior crystallinity region, and to increase the productivity of the display device. Moreover, since a laser irradiation process of a large substrate can be carried out effectively by the present invention, the productivity of the display device can be increased. Therefore, the manufacturing cost of a large-screen display device can be decreased. Further, the display portion 2203 may include a memory, a driver circuit portion, or the like, and the semiconductor device of the present invention may be applied to the memory, the driver circuit portion, or the like. The display device includes various display devices in which thin film transistors and various display media are combined, such as a liquid crystal display device using an electro-optic effect of a liquid crystal, a display device using a luminescent material such as electroluminescence, a display device using an electron source element, a display device using a contrast medium (also referred to as electronic ink) whose reflectivity depends on the application of a magnetic field and the like. The display device can be used for all kinds of information display appliances, such as computers, televisions, information display appliances like electronic books, advertisement display, or guidance display.

Figure 10B:
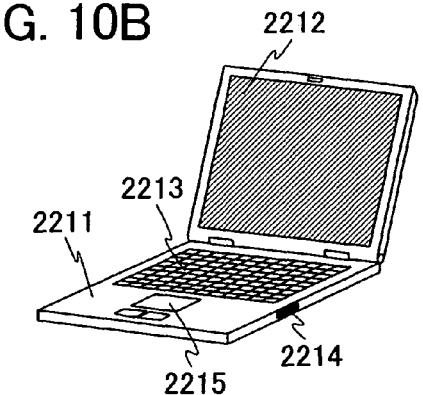

FIG. 10B shows a computer including a casing 2211, a display portion 2212, a keyboard 2213, an external connection port 2214, a pointing mouse 2215, or the like. Thin film transistors are used in the display portion 2212 or a CPU, a memory, a driver circuit portion, or the like included in the computer. By using the thin film transistors manufactured by using the laser irradiation apparatus of the present invention in the display portion 2212 or the CPU, the memory, the driver circuit portion, and the like included in the computer, the product quality can be improved and the variation in the product quality can be decreased.

Figure 10C:
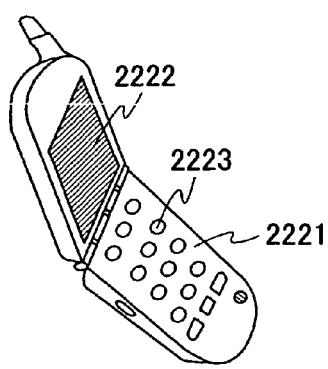

FIG. 10C shows a mobile phone which is a typical example of mobile terminals. This mobile phone includes a casing 2221, a display portion 2222, an operation key 2223, or the like. Thin film transistors are used in the display portion 2222 or a functional circuit such as a CPU or a memory included in the mobile phone. By using the thin film transistors manufactured by using the laser irradiation apparatus of the present invention in the display portion 2222 or a functional circuit such as a CPU or a memory included in the mobile phone, the product quality can be improved and the variation in the quality can be decreased. The semiconductor devices manufactured by using the laser irradiation apparatus of the present invention can be used in electronic devices such as PDAs (Personal Digital Assistant), cameras such as digital cameras, and compact game machines, in addition to the mobile phone.

Figure 10D:
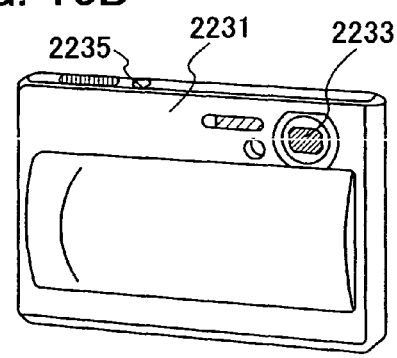
Figure 10E:
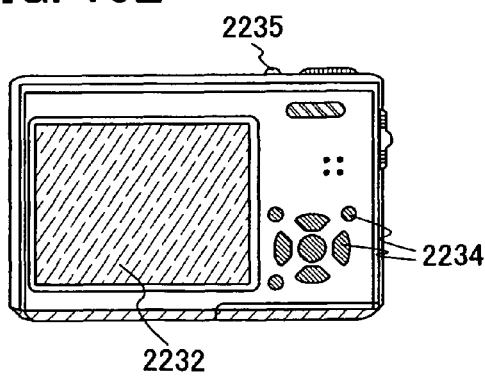

FIGS. 10D and 10E show a digital camera. FIG. 10E shows a rear side of the digital camera shown in FIG. 10D. This digital camera includes a casing 2231, a display portion 2232, a lens 2233, operation keys 2234, a shutter 2235, or the like.

Thin film transistors are used in the display portion 2232, a driver circuit portion for controlling the display portion 2232, or the like. By using the thin film transistors manufactured by using the laser irradiation apparatus of the present invention to the display portion 2232, the driver circuit portion for controlling the display portion 2232, and other circuits, the product quality can be improved and the variation in the product quality can be decreased.

Figure 10F:
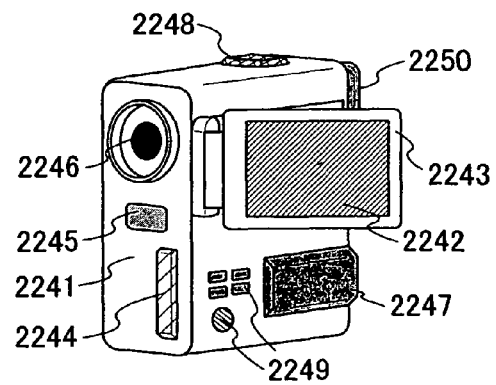

FIG. 10F shows a digital video camera including a main body 2241, a display portion 2242, a casing 2243, an external connection port 2244, a remote control receiving portion 2245, an image receiving portion 2246, a battery 2247, an audio input portion 2248, operation keys 2249, an eyepiece portion 2250, or the like. Thin film transistors are used in the display portion 2242, a driver circuit portion for controlling the display portion 2242 or the like. By using the thin film transistors manufactured by using the laser irradiation apparatus of the present invention to the display portion 2242, the driver circuit portion for controlling the display portion 2242, and other circuits, the product quality can be improved and the variation in the product quality can be decreased.

Moreover, the thin film transistors manufactured by using the method of correcting misalignment of a laser irradiation position of the present invention can be used for a thin film integrated circuit or a contactless thin film integrated circuit device (also referred to as a wireless IC tag or an RFID (Radio Frequency IDentification) tag). A thin film integrated circuit and a contactless thin film integrated circuit manufactured by using the manufacturing method shown in any of other embodiment modes can be used for a tag or a memory.

Figure 11A:
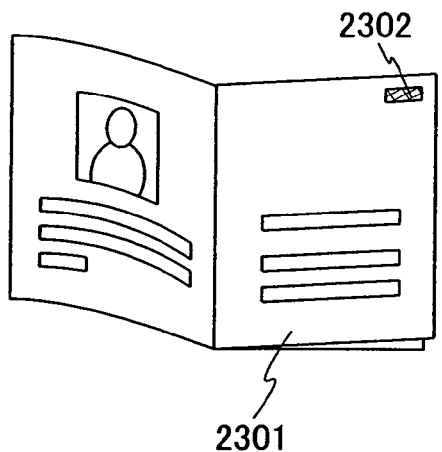
FIGS. 11A and 11B each show an electronic device using a semiconductor device manufactured according to an aspect of the present invention.

FIG. 11A shows a passport 2301 with a wireless IC tag 2302 pasted thereto. Alternatively, the wireless IC tag 2302 may be embedded in the passport 2301. Similarly, the wireless IC tag can be attached or embedded in a driver's license, a credit card, a banknote, a coin, a certificate, a merchandise coupon, a ticket, a traveler's check (T/C), a health insurance card, a resident card, a family register, or the like. In this case, only the information saying this is the real one is input in the wireless IC tag and an access authority is set so that the information cannot be read and written illegally. By using the tag in this way, it is possible to distinguish the forged one and the real one.

Figure 11B:
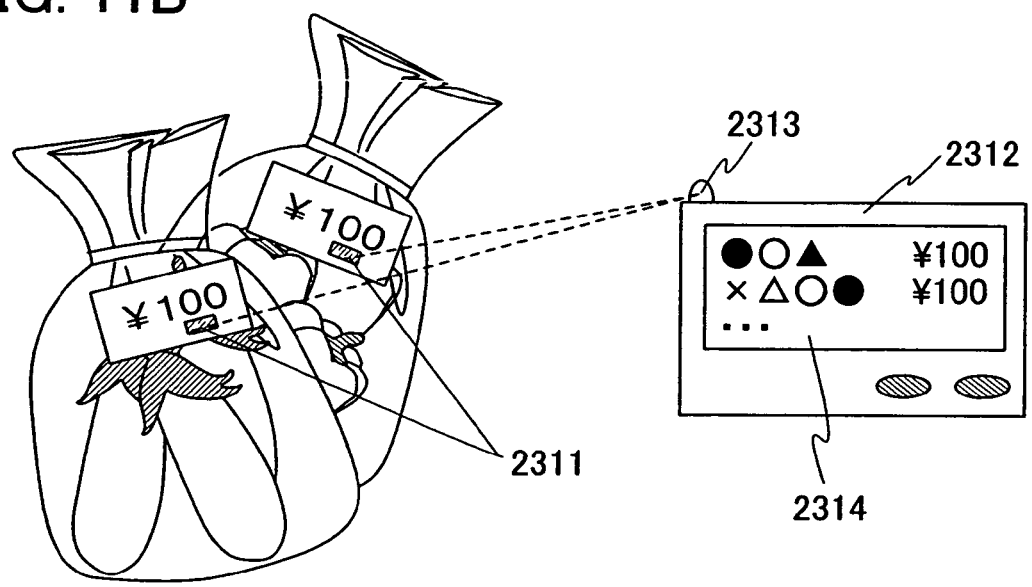

Besides, the wireless IC tag can be used as a memory. FIG. 11B shows an example of embedding a wireless IC tag 2311 in a label to be pasted to a package of vegetables. Alternatively, the wireless IC tag may be attached directly to the package or embedded in the package. In the wireless IC tag 2311, a production area, a producer, a manufacturing date, and a process at a production stage such as a process method, a circulation process of the product, a price, quantity, an intended purpose, a shape, weight, an expiration date, each kind of authentication information, or the like can be recorded. Information from the wireless IC tag 2311 is received by an antenna portion 2313 of a wireless reader 2312 and read out thereby, and displayed in a display portion 2314 of the reader 2312. Thus, wholesalers, retailers, and consumers can know the information easily. Moreover, access authority can be set for each of producers, traders, and consumers. Those who do not have the access authority cannot read, write, rewrite, and erase the data in the wireless IC tag.

The wireless IC tag can be used in the following way. At the payment, the information that the payment has been made is written in the wireless IC tag, and the wireless IC tag is checked by a checking means provided at an exit, about whether or not the information that the payment has been made is written in the wireless IC tag. If the IC tag is brought out from the store without making the payment, the alarm rings. With this method, forgetting of the payment and shoplifting can be prevented.

In consideration of protecting customer's privacy, the following method is also possible. At the payment at a cash register, any of the followings is conducted; (1) data input in the wireless IC tag are locked by pin numbers or the like, (2) data itself input in the wireless IC tag are encrypted, (3) data input in the wireless IC tag are erased, and (4) data input in the wireless IC tag are destroyed. Then, a checking means is provided at an exit, and whether any one of (1) to (4) has been conducted or whether the data in the wireless IC tag are not processed is checked such that whether the payment has been made or not is checked. In this way, whether the payment has been made or not can be checked in the store, and reading out the information in the wireless IC tag against the owner's will outside the store can be prevented.

Several methods are given to destroy the data input in the wireless IC tag in (4). For example, (a) only data are destroyed by writing one or both of "0(off)" and "1(on)" in at least a part of electronic data in the wireless IC tag, or (b) current is fed excessively in the wireless IC tag to physically destroy a part of a wiring included in a semiconductor element in the wireless IC tag.

Since the manufacturing cost of these wireless IC tags mentioned above is higher than that of conventionally used barcodes, the cost reduction should be done. According to the present invention, however, since a laser beam can be delivered at a predetermined position of a semiconductor film with accuracy, and the predetermined position can be laser-annealed evenly. Therefore, semiconductor devices with favorable product quality and no variation can be effectively manufactured, which leads to cost reduction of electronic devices using the semiconductor devices. Furthermore, highly reliable wireless IC tags, all of which have high product quality and no variation of performance, can be manufactured.

As thus described, the semiconductor device manufactured by the present invention can be applied in a wide range, and the semiconductor device manufactured by the present invention can be applied to electronic appliances of every field.

The present application is based on Japanese Patent application No. 2005-367270 filed on Dec. 20, 2005 in the Japanese Patent Office, the entire contents of which are hereby incorporated by reference.

EXPLANATION OF REFERENCE

100: laser oscillator, 101: laser beam, 103: optical system, 104: glass substrate, 105: illumination device, 106: camera, 107: video processing unit, 108: monitor, 109: XY stage, 110: driving device, 111: controller, 201: marker, 202: marker, 203: semiconductor film, 204: linear beam, 211: region, 301: irradiation region, 302: 303: large crystal grain region, 304: inferior crystalline region, non-irradiation region, 401: marker, 402: marker, 403: marker, 502: slit, 503: mirror, 504: cylindrical lens, 505: cylindrical lens, 508: .theta. stage, 509: X-axis stage, 510: Y-axis stage, 700: insulating substrate, 701: base film, 702: amorphous semiconductor film, 703: crystalline semiconductor membrane, 704: semiconductor film, 708: gate insulating film, 710: N-channel transistor, 711: P-channel transistor, 714: insulating film, 715: organic insulating film, 716: wiring, 724: insulating film, 801: alignment marker, 2201: casing, 2202: support, 2203: display portion, 2204: speaker portion, 2205: video input terminal, 2211: casing, 2212: display portion, 2213: keyboard, 2214: external connection port, 2215: pointing mouse, 2221: casing, 2222: display portion, 2223: operation key, 2231: casing, 2232: display portion, 2233: lens, 2234: operation key, 2235: shutter, 2241: main body, 2242: display portion, 2243: casing, 2244: external connection port, 2245: remote control receiving portion, 2246: image receiving portion, 2247: battery, 2248: audio input portion, 2249: operation key, 2250: eyepiece portion, 2301: passport, 2302: wireless IC tag, 2311: wireless IC tag, 2312: reader, 2313: antenna portion, 2314: display portion, 512a: marker, 606a: crystalline semiconductor film.

The invention claimed is:

1. A laser irradiation apparatus comprising:
a laser oscillator emitting a laser beam;
an optical system which shapes the laser beam into a linear beam on a surface of an irradiation object to irradiate the surface of the irradiation object with the linear beam;
an X-Y stage disposed to provide the irradiation object over the X-Y stage to anneal a region of the irradiation object by the irradiation with the linear beam;
an illumination device which obliquely emits light to the surface of the irradiation object irradiated with the linear beam; and
a camera for detecting the annealed region of the irradiation object,
wherein the XY stage is equipped to move the irradiation object based on misalignment between a predetermined irradiation position and the annealed region of the irradiation object to irradiate the irradiation object with the linear beam at the predetermined irradiation position.

2. A laser irradiation apparatus according to claim 1, wherein the irradiation object is a semiconductor film formed over a glass substrate.

3. A laser irradiation apparatus according to claim 1, wherein the laser oscillator is one of a YAG laser, a $YVO_4$ laser, a $GdVO_4$ laser, a YLF laser, and an Ar laser.

4. A laser irradiation apparatus comprising:
a laser oscillator emitting a laser beam;
an optical system which shapes the laser beam into a linear beam on a surface of an irradiation object to irradiate the surface of the irradiation object with the linear beam;
an X-Y stage disposed to provide the irradiation object over the X-Y stage to anneal a region of the irradiation object by the irradiation with the linear beam;
an illumination device which obliquely emits light to the surface of the irradiation object irradiated with the linear beam to reflect and scatter the light on the surface of the annealed region of the irradiation object; and
a camera for detecting the annealed region of the irradiation object,
wherein the XY stage is equipped to move the irradiation object based on misalignment between a predetermined irradiation position and the annealed region of the irradiation object to irradiate the irradiation object with the linear beam at the predetermined irradiation position.

5. A laser irradiation apparatus according to claim 4, wherein the irradiation object is a semiconductor film formed over a glass substrate.

6. A laser irradiation apparatus according to claim 4, wherein the laser oscillator is one of a YAG laser, a $YVO_4$ laser, a $GdVO_4$ laser, a YLF laser, and an Ar laser.

7. A laser irradiation apparatus comprising:
a laser oscillator emitting a laser beam;
an optical system which shapes the laser beam into a linear beam on a surface of a semiconductor film to irradiate the surface of the semiconductor film with the linear beam;

an X-Y stage disposed to provide the semiconductor film over the X-Y stage to crystallize a region of the semiconductor film by the irradiation with the linear beam;

an illumination device which obliquely emits light to the surface of the semiconductor film irradiated with the linear beam to reflect and scatter the light on the surface of the crystallized region of the semiconductor film; and a camera for detecting the crystallized region of the semiconductor film, wherein the XY stage is equipped to move the semiconductor film based on misalignment between a predetermined irradiation position and the crystallized region of the semiconductor film to irradiate the semiconductor film with the linear beam at a predetermined irradiation position.

8. A laser irradiation apparatus according to claim 7, wherein the irradiation object is a semiconductor film formed over a glass substrate.

9. A laser irradiation apparatus according to claim 7, wherein the laser oscillator is one of a YAG laser, a $YVO_4$ laser, a $GdVO_4$ laser, a YLF laser, and an Ar laser.

10. A laser irradiation method comprising:
emitting a laser beam from a laser oscillator;
shaping the laser beam into a linear beam;
irradiating a surface of an irradiation object with the linear beam to anneal a region of the irradiation object by the irradiation with the linear beam;
detecting the annealed region of the irradiation object by a camera; and
moving the irradiation object based on misalignment between a predetermined irradiation position and the annealed region of the irradiation object to irradiate the irradiation object with the linear beam at a predetermined irradiation position.

11. A method according to claim 10, wherein the linear beam is emitted from a laser oscillator selected from the group consisting of a YAG laser, a $YVO_4$ laser, a $GdVO_4$ laser, a YLF laser, and an Ar laser.

12. A method for manufacturing a semiconductor device comprising:
emitting a laser beam from a laser oscillator;
shaping the laser beam into a linear beam;
irradiating a surface of a semiconductor film with the linear beam to crystallize a region of the semiconductor film by the irradiation with the linear beam;
detecting the crystallized region of the semiconductor film by a camera; and
moving the semiconductor film based on misalignment between a predetermined irradiation position and the crystallized region of the semiconductor film to irradiate the semiconductor film with the linear beam at a predetermined irradiation position.

13. A method according to claim 12 wherein the semiconductor film is formed over a glass substrate.

14. A method according to claim 12, wherein the linear beam is emitted from a laser oscillator selected from the group consisting of a YAG laser, a $YVO_4$ laser, a $GdVO_4$ laser, a YLF laser, and an Ar laser.

15. A method according to claim 12 wherein the semiconductor device is incorporated into one selected from the group consisting of a display, a computer, a mobile phone, a camera, and a passport.

* * * * *